(12) United States Patent
Altman et al.

(10) Patent No.: US 9,091,781 B2
(45) Date of Patent: Jul. 28, 2015

(54) METHOD FOR ESTIMATING FORMATION PERMEABILITY USING TIME LAPSE MEASUREMENTS

(75) Inventors: Raphael Altman, Houston, TX (US); John C. Rasmus, Richmond, TX (US); Carlos Maeso, Purtajaya (MY)

(73) Assignee: Schlumberger Technology Corporation, Sugar Land, TX (US)

( * ) Notice: Subject to any disclaimer, the term of this patent is extended or adjusted under 35 U.S.C. 154(b) by 721 days.

(21) Appl. No.: 12/996,498

(22) PCT Filed: Jun. 3, 2009

(86) PCT No.: PCT/US2009/046153
§ 371 (c)(1),
(2), (4) Date: Apr. 11, 2011

(87) PCT Pub. No.: WO2009/158160
PCT Pub. Date: Dec. 30, 2009

(65) Prior Publication Data
US 2011/0184711 A1    Jul. 28, 2011

Related U.S. Application Data

(60) Provisional application No. 61/075,678, filed on Jun. 25, 2008, provisional application No. 61/110,631, filed on Nov. 3, 2008.

(51) Int. Cl.
| | | |
|---|---|---|
| G06F 17/50 | (2006.01) |
| G06G 7/58 | (2006.01) |
| E21B 49/00 | (2006.01) |
| E21B 47/10 | (2012.01) |
| E21B 21/08 | (2006.01) |
| G01V 3/18 | (2006.01) |
| G01V 3/00 | (2006.01) |
| G01V 3/20 | (2006.01) |

(Continued)

(52) U.S. Cl.
CPC .............. G01V 3/20 (2013.01); E21B 47/024 (2013.01); E21B 49/005 (2013.01); G01V 99/005 (2013.01); G06F 17/50 (2013.01)

(58) Field of Classification Search
CPC ........ G06F 17/50; G01V 99/005; G01V 3/20; E21B 47/024
USPC ........... 703/1, 10; 73/152.05, 152.18, 152.21, 73/152.29; 324/325, 356
See application file for complete search history.

(56) References Cited

U.S. PATENT DOCUMENTS 4,716,973 A * 1/1988 Cobern ........................ 175/50
5,463,549 A  10/1995 Dussan et al.

(Continued)

OTHER PUBLICATIONS

Allen, et al., "Invasion Revisited", Oilfield Review, Jul. 1991, pp. 10-23.

(Continued)

*Primary Examiner* — Omar Fernandez Rivas
*Assistant Examiner* — Angel Calle
(74) *Attorney, Agent, or Firm* — John Vereb; Kimberly Ballew

(57) ABSTRACT

A method for determining permeability of a subsurface formation includes measuring a parameter related to fluid content of the formation at a first time from within a wellbore penetrating the formation. A rate of entry of fluid from the wellbore into the formation is determined from the measurement of the parameter made at the first time. The permeability is determined from the rate of entry.

22 Claims, 9 Drawing Sheets

(51) Int. Cl.
*E21B 47/024* (2006.01)
*G01V 99/00* (2009.01)

(56) References Cited

U.S. PATENT DOCUMENTS

| | | | |
|---|---|---|---|
| 5,606,124 | A | 2/1997 | Doyle et al. |
| 5,663,499 | A | 9/1997 | Semmelbeck et al. |
| 5,963,037 | A | 10/1999 | Brady et al. |
| 6,641,434 | B2 | 11/2003 | Boyle et al. |
| 6,950,749 | B2 * | 9/2005 | Frenkel et al. ............ 702/7 |
| 7,603,237 | B2 * | 10/2009 | Heaton et al. ............ 702/6 |
| 7,814,036 | B2 * | 10/2010 | Chen et al. ............ 706/22 |
| 2004/0133351 | A1 * | 7/2004 | Frenkel et al. ............ 702/7 |
| 2007/0241750 | A1 * | 10/2007 | Akkurt ............ 324/303 |
| 2008/0079433 | A1 * | 4/2008 | Meyer et al. ............ 324/356 |
| 2010/0307742 | A1 * | 12/2010 | Phillips et al. ............ 166/250.01 |

OTHER PUBLICATIONS

Alpak, et al., "Joint Inversion of Pressure and Time-Lapse Electromagnetic Logging Measurements", SPWLA 44th Annual Logging Symposium, Jun. 22-25, 2003.

Alpak, et al., "Numerical Simulation of Mud-Filtrate Invasion in Horizontal Wells and Sensitivity Analysis of Array Induction Tools", SPWLA 43rd Annual Logging Symposium, Jun. 2-5, 2002.

Cannon, et al., "Interpretation of Asymmetrically Invaded Formations with Azimuthal and Radial LWD Data", SPWLA 40th Annual Logging Symposium, 1999.

Li, et al., "A Novel Inversion Method for Interpretation of a Focused MultiSensor LWD Laterolog Resistivity Tool", SPWLA 40th Annual Logging Symposium, May 30-Jun. 3, 1999.

Malik, et al., "Influence of Petrophysical and Fluid Properties on Array-Induction Measurements Acquired in the Presence of Oil-Based Mud-Filtrate Invasion", SPWLA 48th Annual Logging Symposium, Jun. 3-6, 2007.

Salazar, et al., "Automatic Estimation of Permeability From Array Induction Measurements: Applications to Field Data", SPWLA 46th Annual Logging Symposium, Jun. 26-29, 2005.

Semmelbeck, et al., "Invasion-Based Method for Estimating Permeability from Logs", SPE Annual Technical Conference and Exhibition, Oct. 22-25, 1995.

Wu, et al., "Numerical Simulation of Mud-Filtrate Invasion in Deviated Wells", SPE 87919—SPE Reservoir Evaluation & Engineering, Apr. 2004, pp. 143-154.

Yao, et al., "Reservoir Permeability Estimation From Time-Lapse Log Data", SPE 25513—Spe Production Operations Symposium, Oklahoma City, Mar. 21-23, 1993.

International Search Report and Written Opinion issued in PCT/US2009/048153 on Nov. 30, 2009, 5 pages.

Mexican Office Action for Mexican Patent Application No. MX/a/2010/01114 dated Jan. 15, 2013.

* cited by examiner

METHOD FOR ESTIMATING FORMATION PERMEABILITY USING TIME LAPSE MEASUREMENTS

CROSS REFERENCE TO RELATED APPLICATIONS

Priority is claimed from U.S. Provisional Application No. 61/075,678 filed on Jun. 25, 2008 and U.S. Provisional Application No. 61/110,631 filed on Nov. 3, 2008.

STATEMENT REGARDING FEDERALLY SPONSORED RESEARCH OR DEVELOPMENT

Not Applicable.

BACKGROUND OF THE INVENTION

1. Field of the Invention

The invention relates generally to the field of wellbore instruments and well logging methods. More specifically, the invention relates to systems and methods for estimating permeability of subsurface rock formations using electrical resistivity measuring instruments 2. Background Art Well logging instruments are devices configured to move through a wellbore drilled through subsurface rock formations. The devices include one or more sensors and other devices that measure various properties of the subsurface rock formations and/or perform certain mechanical acts on the formations, such as drilling or percussively obtaining samples of the rock formations, and withdrawing samples of fluid naturally present in the pore spaces from the rock formations. Measurements of the properties of the rock formations made by the sensors may be recorded with respect to the instrument axial position (depth) within the wellbore as the instrument is moved along the wellbore. Such recording is referred to as a "well log."

Well logging instruments can be conveyed along the wellbore by extending and withdrawing an armored electrical cable ("wireline"), wherein the instruments are coupled to the end of the wireline. Such conveyance relies on gravity to move the instruments into the wellbore. Extending and withdrawing the wireline may be performed using a winch or similar spooling device known in the art. It is also known in the art to use "logging while drilling" ("LWD") instruments in certain circumstances. Such circumstances include expensive drilling operations, where the time needed to suspend drilling operations in order to make the wellbore accessible to wireline instruments would make the cost of such access prohibitive, and wellbores having a substantial lateral displacement from the surface location of the well. Such circumstances can also include large lateral displacement of the wellbore particularly where long wellbore segments having high inclination (deviation from vertical). In such cases, gravity is not able to overcome friction between the instruments and the wellbore wall, thus making wireline conveyance impracticable. LWD instrumentation has proven technically and economically successful under the appropriate conditions. LWD instrumentation has also proven quite valuable for determining the position of the wellbore with respect to certain types of rock formations during the drilling of the wellbore, such that the wellbore may be drilled to penetrate certain selected rock formations while avoiding others. Such placement is facilitated by transmission of certain LWD measurements to the surface during wellbore drilling operations. By interpreting the measurements made during drilling, the wellbore operator may make suitable adjustments to the wellbore trajectory to maintain the wellbore within selected rock formations.

The use of LWD instruments has also made possible the determination of the condition of certain permeable subsurface rock formations prior to substantial displacement of the originally present fluid disposed in the pore spaces of the rock formations by the liquid phase of fluid used to drill the wellbore. As is known in the art, typical wellbore drilling operations include pumping a liquid having solid particles suspended therein through the pipe string used to drill the wellbore. The suspension performs the functions of maintaining a selected hydrostatic pressure in the wellbore to prevent entry of fluids from the surrounding formations, to maintain mechanical integrity of the wellbore, to cool and lubricate the drill bit as it drills through the rock formations, and to lift the drill cuttings to the surface for treatment and disposal. In order to prevent entry into the wellbore of formation fluids, the density of the drilling fluid is usually selected to provide hydrostatic pressure somewhat greater than the fluid pressure in the pore spaces of permeable subsurface rock formations. A result of such conditions is that the liquid phase of the drilling fluid is displaced into the pore spaces of the formations, in a process called "invasion." At the time wireline wellbore instruments are typically operated, the invasion process has reached equilibrium, that is, a filter cake has deposited on the wellbore wall adjacent to the permeable formations, and little additional liquid phase of the drilling fluid enters the pore spaces of the permeable formations. Wireline electrical resistivity instruments typically include devices that have relatively short axial resolution, and have lateral (radial) response generated laterally proximate the wellbore. Such devices may be combined with other devices that have successively greater lateral response and larger (coarser) axial resolution. Measurements from such combined devices may be processed to provide a result that is representative of the electrical resistivity laterally deep enough into the formation such that there is substantially no effect of the liquid phase of the drilling fluid (the "uninvaded zone"). The results may include an estimate of electrical resistivity of the formation laterally proximate the wellbore such that the electrical resistivity is representative of having some of the mobile original or "native" fluid (i.e., the fluid present in the rock pore spaces prior to any effects caused by drilling) moved by the liquid phase of the drilling fluid (the "flushed zone").

When using LWD instrumentation, the foregoing types of measurements may be made at a time so close to the initial penetration of the rock formation by the drill bit, that relatively shallow invasion has taken place. Thus, the relative lateral dimensions of the flushed zone and the uninvaded zone may be different than those measured at the time of wireline well logging. It is also known in the art to move LWD instrumentation past previously drilled formations one or more times during certain drilling operations. For example, when reinserting the drill string into the wellbore after a drill bit is changed, or when "reaming" or "washing" the wellbore in order to improve its mechanical condition, the LWD instruments may be moved past previously drilled formations and may make measurements at such times. The drilling process also can have periods of time where the LWD instrumentation is stationary in the wellbore, e.g., such as when an additional section of drill pipe is added to the drill string at the surface. The LWD instrumentation may be configured to continue to make measurements of the formation in front of the sensor during these stationary times. Such repeated measurements and continuing stationary sensor measurements may provide a basis to estimate permeability of the formations penetrated by a wellbore.

SUMMARY OF THE INVENTION

One embodiment of the invention provides a method for determining permeability of a subsurface formation includes measuring a parameter related to fluid content of the formation at a first time from within a wellbore penetrating the formation. A rate of entry of fluid from the wellbore into the formation is determined from the measurements of the parameter made at the first time. The permeability is determined from the rate of entry.

Another embodiment of the invention provides a computer program stored in a computer readable medium. The program includes logic operable to cause a programmable computer to perform steps, which include reading measurements of a parameter related to fluid content of a subsurface rock formation made at a first time from within a wellbore penetrating the formation. A rate of entry of fluid from the wellbore into the formation is determined from the measurements of the parameter made at the first time. A permeability is determined from the rate of entry.

Other embodiments, aspects and advantages of the invention will be apparent from the following description and the appended claims.

DETAILED DESCRIPTION

Figure 1:
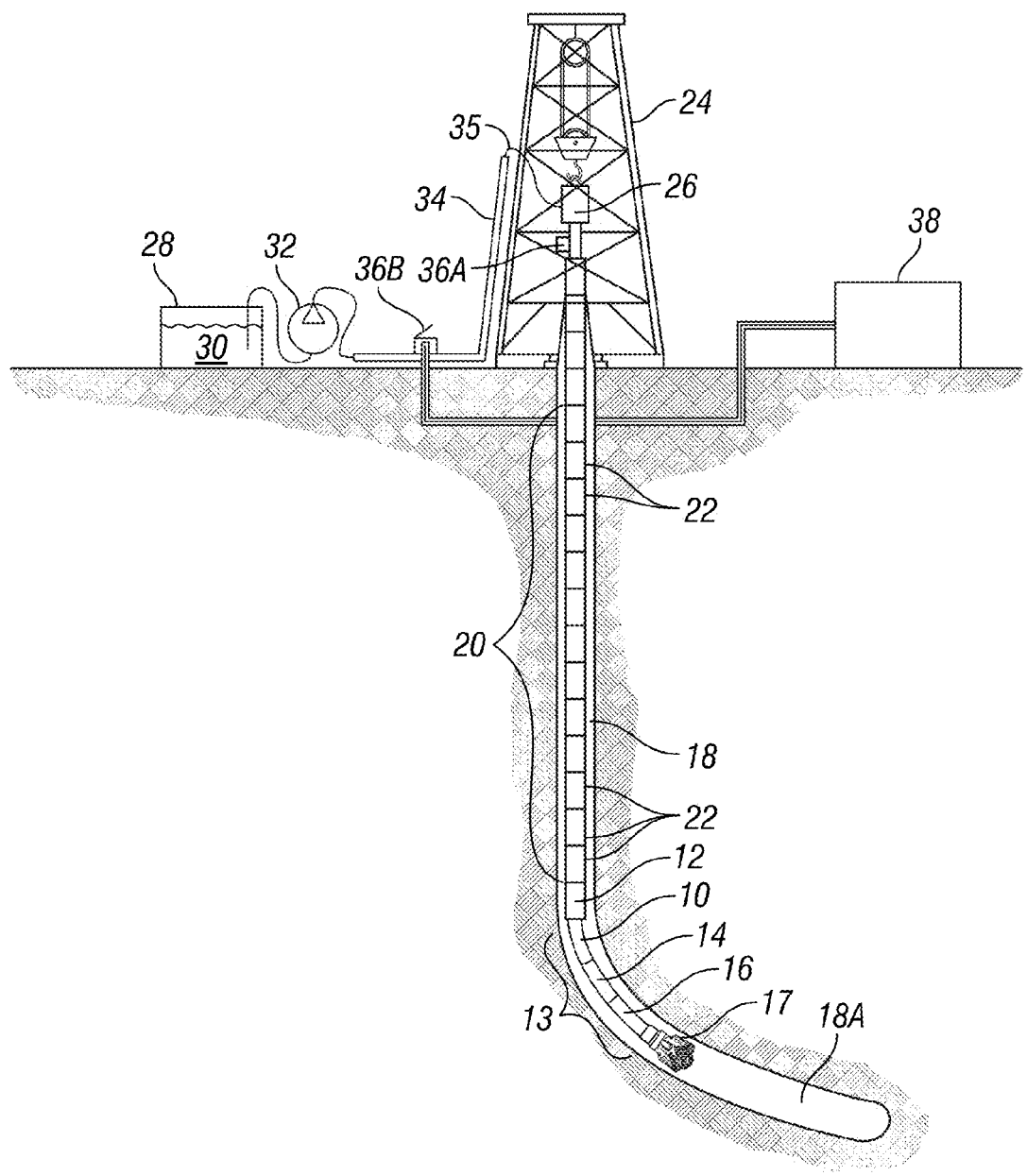
FIG. 1 shows an example of well logging instruments being conveyed through a wellbore using a pipe string. In one example, the pipe string is a "wired" pipe string.

In FIG. 1, a drilling rig 24 or similar lifting device moves a conduit or pipe called a "pipe string" or "drill string" 20 within a wellbore 18 that is being drilled through subsurface rock formations, these formations being shown generally at 11. The drill string 20 may be extended into the wellbore 18 by threadedly coupling together end to end a number of segments ("joints") 22 of drill pipe. In some examples, the drill string may be a so-called "wired" pipe string. Wired drill pipe is structurally similar to ordinary drill pipe and further includes at least one electrical conductor or at least one optical fiber associated with each pipe joint to act as a signal communication channel. Wired drill pipe includes some form of signal coupling to communicate signals along the channel between pipe joints when the pipe joints are coupled end to end as shown in FIG. 1. See, as a non-limiting example, U.S. Pat. No. 6,641,434 issued to Boyle et al. and assigned to the assignee of the present invention for a description of a type of wired drill pipe that can be used with the present invention. It should be understood that the present invention may also be operated with ordinary drill pipe that does not include such signal communication channel.

The drill string 20 may include an assembly or "string" of wellbore instruments at a lower end thereof, shown generally at 13 and which may include "logging while drilling" ("LWD") instruments, which are configurable to be used during drilling operations and which form part of the pipe string itself. "Drilling operations" as used herein means essentially any function related to using the drill string in the wellbore, including without limitation actual lengthening of the wellbore by operating a drill bit (explained below), moving the drill string into or out of the wellbore, and maintaining position of the drill string with drilling fluid established or not.

Several of the components disposed proximate the drilling unit 24 may be used to operate part of the drilling and LWD system. These components will be explained with respect to their uses in drilling the wellbore to better enable understanding the invention. The drill string 20 may be rotated by equipment on the rig (explained below) in order to turn and axially urge a drill bit 17 into the bottom of the wellbore 18 to increase its axial length (referred to as "depth"). During drilling of the wellbore 18, a pump 32 lifts drilling fluid ("drilling mud") 30 from a tank or pit 28 and discharges the mud 30 under pressure through a standpipe 34 coupled to a flexible conduit 35 or hose, through the top drive 26 and into an interior passage (not shown separately in FIG. 1) inside the drill string 20. The mud 30 exits the drill string 20 through courses or nozzles (not shown separately) in the drill bit 17, where it then cools and lubricates the drill bit and lifts drill cuttings generated by the drill bit 17 to the Earth's surface. During LWD well logging operations, the pump 32 may be operated to provide fluid flow to rotate one or more turbines (not shown in FIG. 1) in the LWD instrument string 13 to provide electrical and/or hydraulic power to operate certain devices in the LWD instrument string 13.

As the LWD instrument string 13 is moved along the wellbore 18 by moving the drill string 20 as explained above, signals detected by various sensing devices, non-limiting examples of which may include a combination density/neutron porosity instrument 16, a gamma ray sensor 14 and an electrical resistivity sensor assembly 10 are selected to be included in a telemetry format for transmission to the surface using a telemetry converter sub 12 for communication along the signal channel (if a wired pipe string is used), and/or by modulating flow of the drilling mud 30 using a mud flow modulation valve (not shown separately) of any type known in the art. At the surface, a telemetry transmitter 36A can be used to wirelessly transmit signals from the drill string 20 (if wired) to a receiver 36B. Thus, the drill string 20 (if wired) may be freely moved, assembled, disassembled and rotated without the need to make or break a wired electrical or optical signal connection. Signals from the receiver 36B, which may be electrical and/or optical signals, for example, may be conducted (such as by wire or cable) to a recording unit 38 for decoding and interpretation using techniques well known in the art. The decoded signals typically correspond to the measurements made by one or more of the sensors in the well logging instruments 10, 14, 16. Other sensors known in the art include, without limitation, acoustic travel time or velocity sensors, seismic sensors, neutron induced gamma spectroscopy sensors and nuclear magnetic resonance sensors. It should be understood that the transmitter 36A and receiver 36B may be substituted by transceivers so that signal communication may also be provided from the recording system 38 to the LWD instrument string 13 or any component thereof. Preferably at least one of the sensors in the LWD instrument string makes measurements related to the fractional volume of pore space ("porosity") of the formations 11 adjacent to the wellbore 18.

The functions performed by the converter sub 12 may include providing a mechanical coupling (explained below) between the pipe string 20 (e.g., at the lowermost threaded connection) and an uppermost connection on the well logging instrument string 13. The converter sub 12 may also include one or more devices (explained below) for producing electrical power to operate various parts of the well logging instruments 13. Finally, the converter sub 12 may include signal processing and recording devices (explained below with reference to FIG. 4) for selecting particular signals from the well logging instrument string 13 for transmission to the surface using the communication channel in the pipe string 20 (if wired) and recording signals in a suitable storage or recording device in the converted sub 12. Signals transmitted from the surface may be communicated through the communication channel in the drill string 20 (if wired) to the instrument string 13 through the various devices in the power sub 12.

In addition, or in substitution of the foregoing, mud flow modulation telemetry according to types well known in the art may be used to communicate certain measurements to the surface. For example, receiver 36B may include a pressure transducer (not shown separately) for detecting the pressure of the mud 30 as it is discharged from the pump 32. Changes in pressure caused by the modulator (not shown separately) in the converter sub 12 may be decoded and interpreted to correspond to certain measurements made by the various sensors in the LWD instrument string 13.

It will be appreciated by those skilled in the art that in other embodiments the top drive 26 may be substituted by a swivel, kelly, kelly bushing and rotary table (none shown in FIG. 1) for rotating the pipe string 20 while providing a pressure sealed passage through the pipe string 20 for the mud 30. Accordingly, the invention is not limited in scope to use with top drive drilling systems.

A sensor associated with the top drive 26 (or swivel in kelly/kelly bushing rotary drive systems) may be used to determine the elevation of the top drive 26 over the drill floor of the rig at any time. The top drive elevation may be combined with a record of the lengths of all the components in the drill string 20, including the pipe joints 22, converter sub 12 and the well logging instruments 10, 14, 16 such that a record with respect to time of the axial length (depth) of the wellbore 18 may be made. The axial position of each sensor in each LWD instrument is known or is determinable with respect to the lowermost face of the drill bit 17 or other positional reference along the drill string 20. Using such position information, drill string length and the top drive elevation, the axial position of each LWD sensor at any time may be recorded, e.g., in the recording unit 38. The purpose for such time indexed position record as it relates to the invention will be explained in more detail below.

Figure 2:
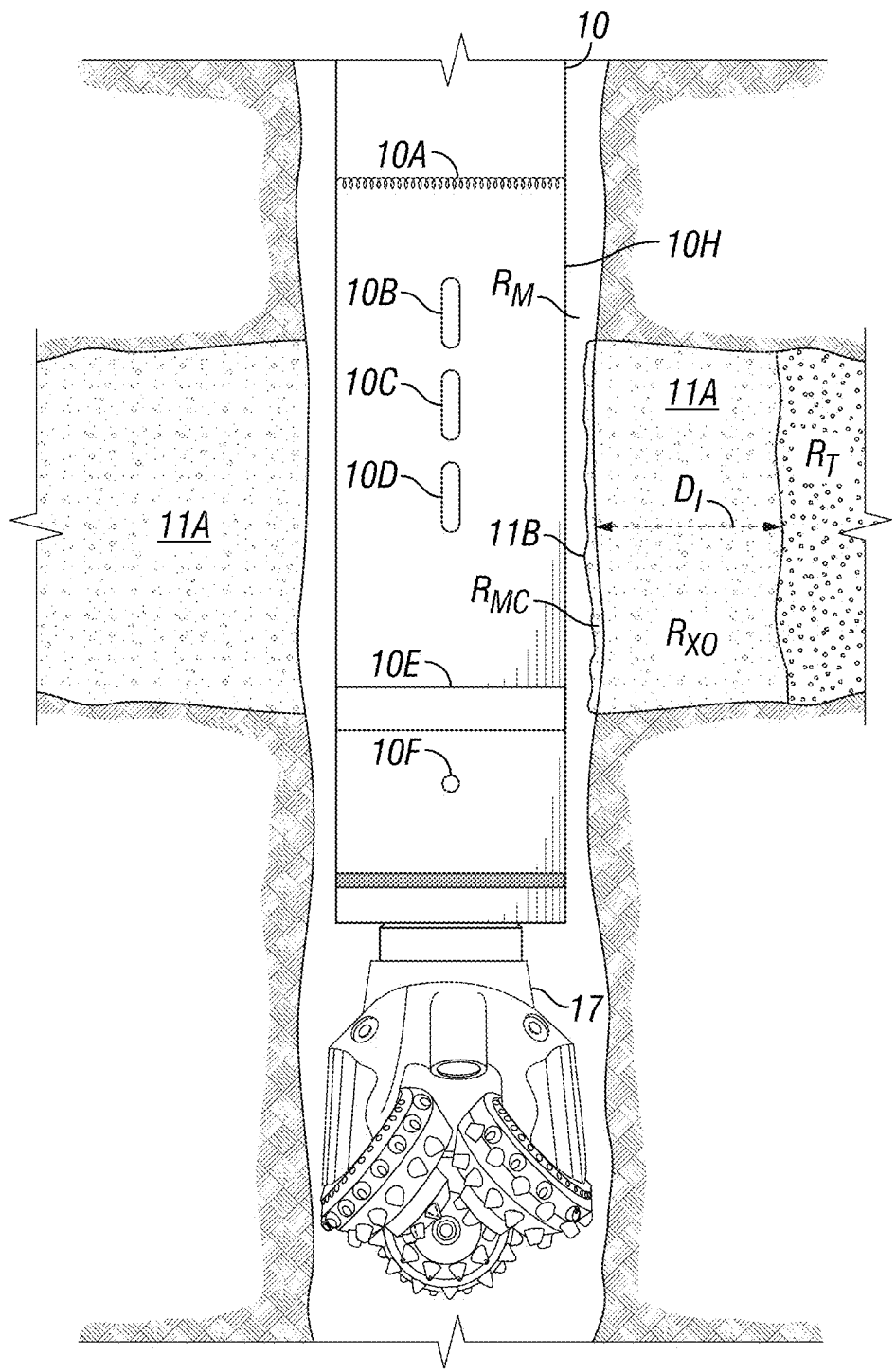
FIG. 2 shows an example of a logging while drilling (LWD) instrument that may be used in some examples.

An example LWD resistivity instrument (e.g., shown at 10 in FIG. 1) is shown in more detail in FIG. 2 to illustrate certain measurements that can be used with a method according to the invention. The instrument 10 shown in FIG. 2 may be the same as or similar to one used to provide services under the mark GeoVISION, which is a service mark commonly owned with the present invention. The instrument 10 may include certain devices disposed within a housing 10H, wherein the housing 10H is configured to be coupled within the drill string (20 in FIG. 1). The devices can include, for example, a toroidal electromagnetic transmitter 10A configured to enable electromagnetic radiation therefrom to travel through the wellbore (18 in FIG. 1) and through the formations (11 in FIG. 1). Certain sensing devices on the instrument 10 are configured to detect voltage drop and/or electromagnetically induced voltages resulting from electromagnetic energy from the toroidal transmitter 10A. Such sensors may include button electrodes 10B, 10C, 10D disposed at successively longer longitudinal distances along the housing 10H from the position of the transmitter 10A. The sensors may include a ring electrode 10E disposed at even greater longitudinal distance from the transmitter 10A. In some configurations, the drill bit 17 may be used as an electrode as part of a voltage drop measuring circuit. In some examples a pressure sensor 10F may be configured to measure fluid pressure in an annular space between the instrument 10 and the wall of the wellbore (18 in FIG. 1) for purposes to be explained further below.

An aspect of the device shown in FIG. 2 and described in the foregoing brochure is that the button electrodes 10B, 10C, 10D each make a measurement corresponding to electrical resistivity at successively greater lateral or radial displacement ("depth") from the wellbore wall, and therefore respond differently for any particular spatial distribution of electrical resistivity proximate the wellbore wall. The spatial distribution of electrical resistivity in a permeable formation proximate the wellbore wall is related to the depth of "invasion" of mud filtrate into the permeable rock formation, the difference between the resistivity of the displaced, connate water and/or the fractional volume of displaced hydrocarbon and the resistivity of the mud filtrate. Another aspect of the instrument shown in FIG. 2 is that the resistivity measurements made by the button electrodes 10B, 10C, 10D subtend a relatively small angular portion of the circumference of the formations surrounding the wellbore, and thus may be inferred to have measured the resistivity response along an azimuthal direction corresponding to the particular rotational orientation of the button electrodes at any time. Rotational orientation may be defined as an angle subtended between a line normal to the instrument longitudinal axis extending through one of the button electrodes and a geodetic or other reference line, or more succinctly, the rotational orientation of the button electrodes with respect to the reference. During drilling and other wellbore operations, certain sensors in the LWD instrument string (13 in FIG. 1) may be used to determine the rotational orientation of the button electrodes with respect to a selected geodetic reference, for example, geomagnetic North, or gravitational vertical. Such sensors and means for determining orientation are well known in the art and need not be explained in further detail herein. See, for example, U.S. Pat. No. 5,606,124 issued to Doyle et al. and incorporated herein by reference for specific examples of such sensors.

FIG. 2 also illustrates the principle of movement ("invasion") of the liquid phase of the drilling mud ("mud filtrate") into a permeable rock formation, e.g., 11A. For purposes of the present example, the formation 11A may be assumed to be hydrocarbon bearing, that is, the pore spaces of the formation 11A are at least partially saturated with oil and/or gas in their undisturbed state. Proximate the wellbore wall, a "filter cake" 11B consisting of solid particles removed from suspension in the mud (30 in FIG. 1) becomes disposed on the face of the permeable formation 11A by the action of differential fluid pressure between the wellbore and the formation. The separated liquid phase of the drilling mud (the mud filtrate) displaces the native fluid originally present in the pore spaces of the formation 11A. Depending on factors including: (i) the volume of fluid that the mud loses before the filter cake 11B, is fully developed and become substantially impermeable; (ii) the fractional volume of pore space of the formation (called "porosity") containing mobile fluid; and (iii) the fluid pressure in the wellbore as compared to the fluid pressure in the rock formation 11A, the mud filtrate will displace mobile fluid to an approximate lateral distance (diameter of invasion) shown in FIG. 2 as $d_i$. At greater lateral distances than the diameter of invasion, $d_i$, the undisturbed native fluid in the formation pore spaces results in the formation having an undisturbed or "true" electrical resistivity Rt. In the zone where mobile fluid displacement by mud filtrate has occurred (generally at lateral distances less than $d_i$), the electrical resistivity of the formation may be referred to as the "flushed zone resistivity" and represented by Rxo.

Various computation programs are known in the art for determining the foregoing three parameters (true resistivity, flushed zone resistivity and diameter of invasion) from measurements made by instruments such as the one shown in FIG. 2 and equivalent instruments. Such programs typically require, as input, resistivity measurements having a plurality of different "depths of investigation", meaning spatially distributed responses, the response for each sensor having a different lateral displacement from the wellbore wall. For the instrument in FIG. 2, the measurements used in the computation may include those from each of the three button electrodes, possibly supplemented by measurements from the bit 17 (as an electrode) and the ring electrode 10E.

One type of such computation program to determine Rxo, Rt and $d_i$ from multiple depth of investigation resistivity measurements is known as "inversion." Inversion may be described in terms of its operation as generating an initial model of the formation structure, including the three result parameters above, namely Rxo, Rt and $d_i$. An expected response of each sensor on the instrument that would result from the initial model is then generated. Such "forward" response calculation may be based on the spatial distribution of the response field of each sensor and the spatial distribution of electrical resistivity of the initial model. The expected instrument response is then compared to the actual measurements made by the instrument. Based on differences between the expected response and the measurements, the initial model may be adjusted (e.g., by changing any or all of the result parameters), and the foregoing is repeated until differences between the expected (forward calculated) responses and the instrument measurements fall below a selected threshold. The adjusted model at that time may be inferred to be the approximate electrical resistivity structure of the subsurface. Such resistivity structure may include the foregoing parameters Rt, Rxo and $d_i$.

LWD instruments in general, including the instrument shown in FIG. 2, make measurements that are indexed with respect to the time at which each sensor is interrogated. Time may be measured by a clock (not shown separately) in the instrument 10 that may be synchronized with a reference clock, e.g., in the recording unit (38 in FIG. 1) at times when the instrument 10 is in signal communication therewith. Signal communication may take place using wired drill pipe in some embodiments, or in other embodiments when the instrument 10 is withdrawn from the wellbore (18 in FIG. 1) and is electrically or optically connected to the recording unit (38 in FIG. 1). The time indexed measurements may be recorded in a data recording or storage device (not shown) in the instrument 10, and/or may be transmitted to the Earth's surface using the communication channel and/or mud flow modulation telemetry. In the case of mud flow modulation data communication, or in still other examples where sensor data are only recorded in the instrument 10, the time indexed records may be later correlated to a time/depth record made at the surface by making the time indexed record of the elevation of the top drive (26 in FIG. 1) explained above and the length of all the components of the drill string (20 in FIG. 1). In combination, a record of the axial position (depth) of each sensor on each LWD instrument with respect to time may be made.

In some examples, each of the resistivity sensors on the instrument 10 may move past a same axial position (e.g., formation 11A) a plurality of times depending on the particular drilling operation being performed at any time. A first movement (called a "pass") may take place during the drilling of the wellbore, such that the sensor makes a first pass thereafter. Later passes may correspond to other drilling operations, such as withdrawing the instrument 10 from the wellbore, "backreaming" (rotating the pipe string while pulling thereon), washing, circulating, inserting the drill string into the wellbore, etc. Records of the measurements made by each sensor (e.g., 10B, 10C, 10D, 10E, 10F) may be correlated to the time/depth record such that particular sensor measurements may be identified for each time a particular position in the well is passed. The measurements made by each sensor may thereby be correlated to the time after initial penetration of any particular formation by the drill bit 17. Such time is typically presented in well log format as a "time since drilled" or "time after bit" curve alongside the particular measurement and/or computer results being displayed in the well log.

By using the instrument shown in FIG. 2, or any similarly configured electrical resistivity instrument, including, as will be explained below, wireline instruments, it is also possible to index the measurements made by the button electrodes 10B, 10C, 10D with respect to the rotary orientation of the button electrodes at any time. As will be further explained below, such rotationally indexed measurements may be used to help estimate permeability anisotropy of certain formations.

During drilling of the wellbore, there is frequently insufficient time for filter cake 11B to settle onto the wellbore wall adjacent permeable rock formations in sufficient amounts for the drilling mud, the formation fluids and filter cake to reach equilibrium, i.e., where substantially no additional mud filtrate permeates the formation. Alternatively, equilibrium-thickness filter cake may become dislodged by the continued action of the drill string (20 in FIG. 1) and/or by erosion due to the flow of the drilling mud (30 in FIG. 1) and drilling tools at the bottom end thereof (including the LWD instrument string 13). As a result, over time additional mud filtrate invasion may occur and it may be possible to obtain time lapse measurements, in particular from the electrodes on the instrument shown in FIG. 2 Such time lapse measurements may then be processed to determine, with respect to time, change(s) in the depth of invasion ($d_i$). As explained above, measurements made by the various sensors in the LWD instrument string are typically indexed with respect to the measurement time, and such time index is associated with each measurement, thus making possible the foregoing described time lapse measurements. Such time based change in the invasion depth may be used along with other measurements made by the LWD instrument string (such as those to calculate fractional volume or rock pore space ("porosity")), to determine the volume rate at which filtrate is entering the formation. Examples of such measurements provided above with reference to FIG. 1 include density and neutron porosity. Determining porosity from well log measurements is well known in the art and need not be explained in further detail with reference to the present invention.

Figure 4:
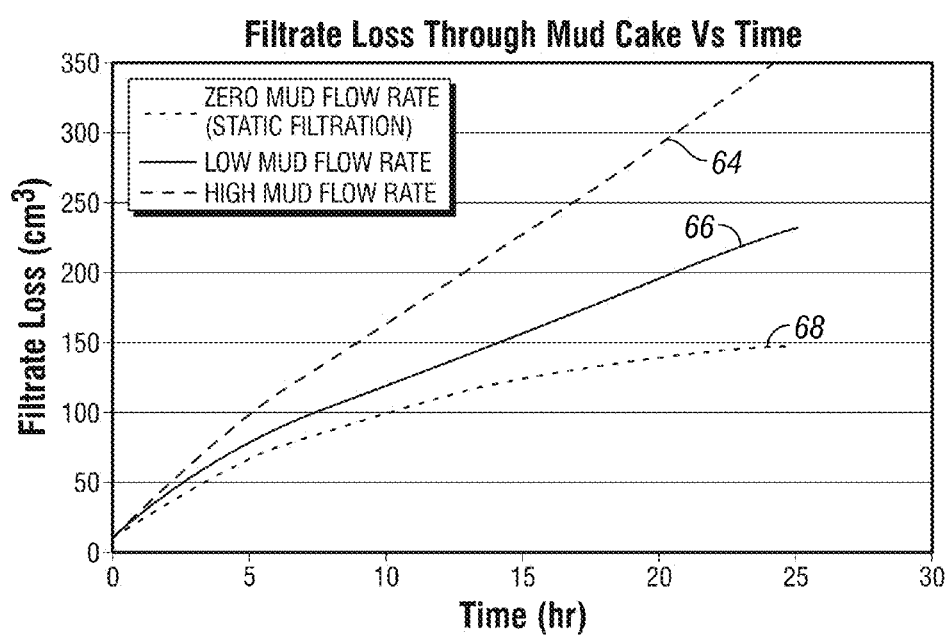
FIG. 4 shows a graph of mud filtrate invasion with respect to time at various drilling mud flow rates.

The mud filtrate volume entry rate determined using time lapse resistivity measurements may be used to estimate permeability of the formation 11A. Referring briefly to FIG. 4, example curves showing relative amounts of mud filtrate permeation through mud cake with respect to time are illustrated for the cases of well drilling using high mud flow, at curve 64, drilling or circulating at low to moderate mud flow, at curve 66, and static conditions (no mud flow), at curve 68. What may be inferred from FIG. 4 is that particularly at high mud flow rates, the amount of filtrate loss may be approximately linear with respect to time. Such relationship may assist in estimating changing filtrate volume with respect to time, (and therefore filtrate invasion rate) and thereby the permeability of selected rock formations.

In one example, the mud filtrate invasion rate into any particular formation can be estimated by calculating the total moved fluid volume divided by the total time, Such rate may be calculated the first time the LWD sensors pass by a formation of interest. The total exposure time of the formation to the wellbore fluid may be determined from the "time since drilled" record made in the LWD instruments. Thus, in a first calculation, an volume of moved fluid may be determined from the inversion explained above, and divided by the time since drilled to obtain a rate of fluid entry. Such procedure may be repeated for subsequent measurements and inversions as long as the time of measurement since the formation was drilled is determinable. In this example, an approximation for the mud filtrate volume may be made by assuming that the mud filtrate is only displacing hydrocarbons from the pore spaces of the rock formation. Such assumption is useful because it is primarily hydrocarbon bearing formations that are of economic interest, and displacement of hydrocarbon by mud filtrate is indicative of the likelihood that such formation will produce hydrocarbon when the well is completed.

Moved hydrocarbon volume for each well log depth increment can be calculated, for example, as the product $$[(0.5*di-0.5*dh)^2*\pi*phi*(Sxo-Sw)*\text{depth increment}]$$

wherein $d_h$ represents the wellbore diameter, phi is the porosity, and the quantities Sxo and Sw represent, respectively the flushed zone water saturation and the undisturbed (native) water saturation. The depth increment may be determined by calculating a difference in depth between successive time-based well log data samples (see the explanation above for how LWD data are recorded). Alternatively, the depth increments may be calculated directly in the recording unit (38 in FIG. 1) if wired drill pipe is used and the measurements from the LWD instrument 10 are communicated to the surface substantially in real time. Regardless of the method of calculation, the depth increment in the above equation represents the depth increment between successive measurements used in the formula. The total moved fluid volume may be determined as the integrated sum of the moved volumes over multiple depth increments. The foregoing calculations may also be performed with reference to bulk fluid volumes according to the expression: $(0.5 d_i - 0.5\ d_h)^2 * \pi * (BVWxo - BVW)*$depth increment, with depth and diameters in similar units as in the previous expressions. BVWxo represents the bulk volume of water in the flushed zone and can be determined by the expression $(Rmf/Rxo)^{(1/w)}$ where Rmf represents the resistivity of the mud filtrate, Rxo represents the flushed zone resistivity and w=m=n. BVW represents bulk volume of water in the uninvaded zone and can be determined by the expression $(Rw/Rt)^{(1/w)}$ where w=m=n.

The moved hydrocarbon fraction can be calculated using any petrophysical volume solver software program. For example, the inversion program used to calculate diameter of invasion and the flushed (Rxo) and uninvaded zone (Rt) resistivities with the GeoVISION service explained above also can compute an approximation of the moved hydrocarbon volume. The initial fractional volume of connate water (Sw) in the formation pore space prior to filtrate invasion can be represented by a simplified form of the Archie equation, e.g., the expression $Sw=(F*Rw/Rt)^{0.5}$, where Rw represents the electrical resistivity of the connate water in the rock pore spaces, and F represents the formation resistivity factor. For simplicity it may be assumed that the Archie equation parameters a=1 and m=n=2, which results in the above expression for Sw. Rxo (the flushed zone electrical resistivity) is assumed to be equal to Rt before substantial invasion has occurred. In practice, it has been determined that if measurements of the resistivity of the formation 11A are made relatively shortly after penetration by the drill bit 17, the resistivity measurements made by an instrument such as the one shown in FIG. 2 are capable of resolving Rt using, for example, the described inversion procedure. The fractional volume of water in the pore spaces in the "flushed" zone (where all mobile fluid has been displaced by mud filtrate), referred to as Sxo, is also determinable by a modified Archie expression, e.g., the expression $Sxo=(FRmf/Rxo)^{0.5}$, where Rmf represents the electrical resistivity of the mud filtrate. Rmf can be measured from samples obtained at the surface. Rw may be determined by extracting samples of formation connate water, or by calculation (e.g., using the Archie expression) from an adjacent or nearly adjacent formation that is inferred to be fully water saturated. Such calculation can be made by the expression Ro=F*Rw, wherein Ro is the electrical resistivity of a fully water saturated porous rock formation and F is the same "resistivity formation factor" referred to earlier. F may be determined using, for example, using empirical relationships with respect to porosity. One example of such relationship is $F=a\varnothing^{-m}$, in which a and m are constants and $\varnothing$ represents the porosity. Porosity may be obtained from certain of the LWD measurements as explained above.

The generalized form of the Archie expressions described above for the uninvaded zone and the flushed zone are, respectively:

$$Sw^n = Rw/(\varnothing^m Rt); \text{ and}$$

$$Sxo^n = Rmf/(\varnothing^m Rxo)$$

Rw and Rmf are fixed parameters that may be input into the above described inversion, the button electrode resistivity measurements at each depth increment are entered as data, and Rt and Rxo and $d_i$ are solved by the inversion. Rt and Rxo may be used with their corresponding measurements of fluid resistivity (Rw and Rmf) to determine any change in the fractional volume of pore space filled with water as between the uninvaded zone and the flushed zone. By calculating water fractional pore space volume (saturation) in the uninvaded zone, typically when the instrument first measures the newly drilled formation, and subtracting the fractional volume of water in the flushed zone, the result is the fractional volume of moved hydrocarbons displaced by the mud filtrate. The bulk volume of displaced or moved hydrocarbon is reasonably assumed to be equal to the bulk volume of mud filtrate invasion. Bulk volume may be determined from fractional volume by multiplying fractional volumes by the porosity (determined, e.g., from other sensors in the LWD instrument string), and using the depth increment explained above to calculate total rock volume. By repeating the foregoing procedure each time the instrument moves past the same axial position (formation) in the wellbore the total volume of mud filtrate invaded into the formation may be determined with respect to time. By determining filtrate invasion volume with respect to time, a rate of infiltration may be determined. It is also possible to determine fluid invasion volume using similar sensor measurement techniques during periods of time when the drill string is stationary in the wellbore (e.g., during addition of a joint of drill pipe to or removal of a joint from the drill string). As explained above, a fluid invasion volume may be determined the first time and any individual subsequent time the measurements are made using the time since drilled information recorded by the LWD instruments, and such time may be used directly to determine rate of invasion from the invasion volume determined from the resistivity measurements.

Those skilled in the art will readily appreciate that corresponding formulas and techniques may be applied in the case where the drilling mud has hydrocarbon as the continuous liquid phase ("oil based mud"), and as a result, the method of the invention is not limited to use with water based drilling fluids.

It should also be clearly understood that subsequent sets of measurements made at later times may be made using well logging instruments conveyed on an armored electrical cable ("wireline"), or coiled tubing, or any other type of conveyance. The method of the invention is not limited to subsequent measurements being made using drill string conveyed (LWD) instruments.

In one embodiment, the foregoing volume rate of filtrate invasion may be combined with a pressure difference between the fluid pressure in the formation 11A and the mud pressure in the wellbore (determined, e.g., using the pressure sensor 10F) to estimate formation permeability. Fluid pressure in the wellbore p may also be determined by calculation using the formula $p=\rho gh$, wherein $\rho$ represents the drilling mud density, g represents acceleration of gravity and h is the true vertical depth of the particular formation.

Figure 5:
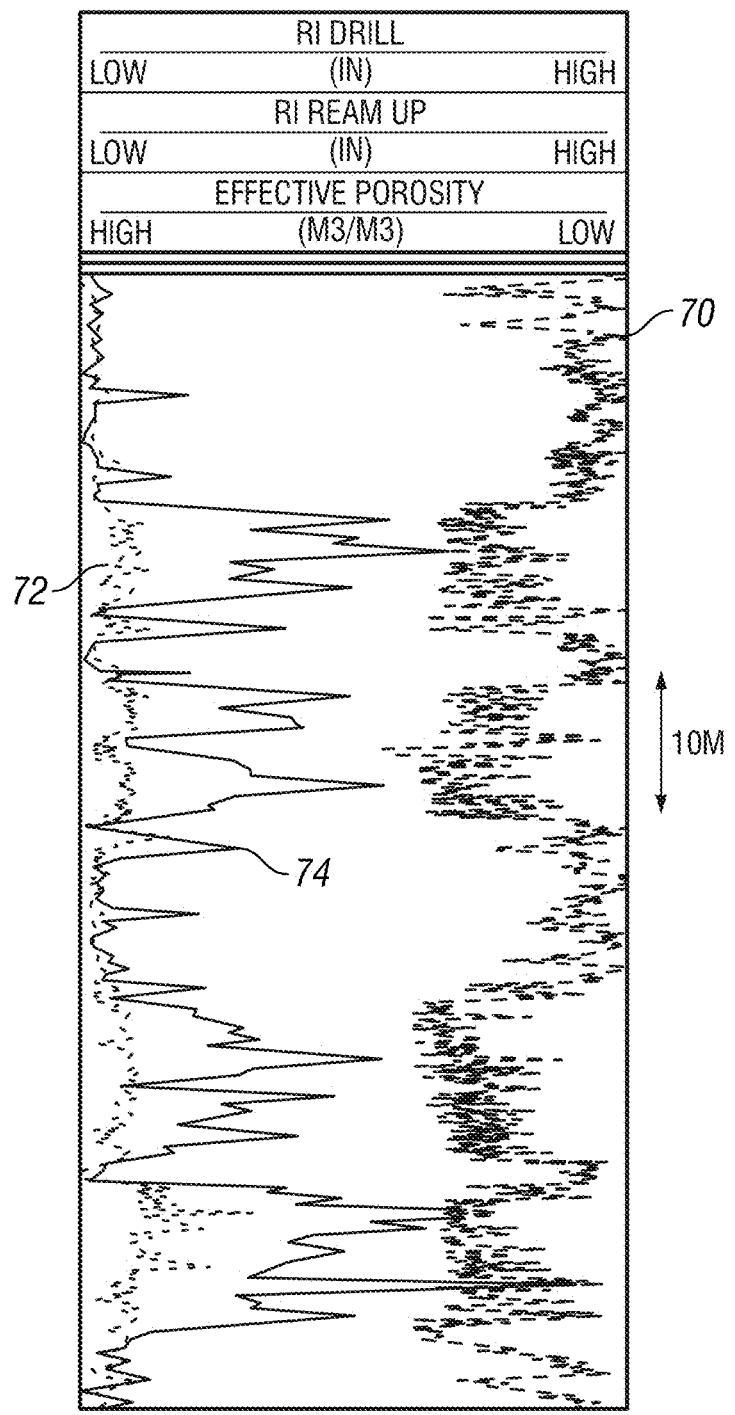
FIG. 5 shows a well log form graph comparing apparent fluid invasion in permeable rock formations at initial penetration and at a later time.

FIG. 5 shows an example of the radii of invasion at the time of initial drilling or penetration of the formation (curve 72) and at a later time, such as during tripping, reaming or washing (curve 74) calculated using the foregoing inversion procedure. Effective porosity of the formations is shown at curve 70. Separation between curves 72 and 74 indicates that dynamic mud infiltration is taking place into the permeable rock formations. Curves 72 and 74 show that there is a moving fluid invasion "front" advancing laterally into the formation with respect to increasing time since the initial penetration of the formation by the drill bit (17 in FIG. 1).

"Spurt loss" may be characterized as mud filtrate invasion that occurs in the first couple of minutes after a formation is initially drilled by the bit, prior to build up of any effective thickness of mud cake. It has been observed that the "spurt loss" filtrate invasion rate can be considerably larger than the equilibrium dynamic filtrate invasion rate. Therefore, one example technique is to compute the mud filtrate invasion rate by calculating the difference between the mud filtrate invasion volume at the time of a subsequent (e.g., reaming or tripping) movement of the LWD instrument past a selected formation and the initial drilling thereof, divided by the total elapsed time between the measurements made at each such time. The foregoing procedure can minimize the influence of the spurt loss on the analysis. It is contemplated that a greater number of LWD instrument passes over time and corresponding measurements made in a selected rock formation will provide even more reliable estimation(s) of permeability because the determined filtrate invasion volume with respect to time will correspond to the graphs in FIG. 4, and thereby enable the user to better quantify the invasion volume and invasion rate at any particular time during the invasion process.

An additional procedure can be used to further refine the calculation of the mud filtrate invasion rate using a reservoir simulation software program. A series of grid cells around the wellbore is initialized and the invasion process is modeled using the reservoir simulation software program. One such program is sold under the trademark ECLIPSE, which is a trademark commonly owned with the present invention. Other reservoir simulation programs capable of performing similar functions are known in the art. Such reservoir simulation programs subdivide the volume of subsurface rock formations into discrete, selectable volume "grid cells." By using such simulation program, the mud filtrate invasion rate calculated for each grid cell can be compared to the results of the inversion analysis as explained above, e.g., using the GeoVISION instrument's measurements. One advantage of such comparative method is better quantification of the amount of time that any particular section of the wellbore has been exposed to mud filtrate from the time it was initially drilled to the time the specific measurements were made. This elapsed time can be calculated by summing the time beginning with the moment in time that the formation was initially drilled until the point in time that the drill string is removed from the wellbore, plus any amount of time spent in auxiliary operations including "back reaming" (rotating the drill string while pulling) and any time after the bit penetrates the particular depth point for any other auxiliary operation. By determining the total exposure time of the formation to the wellbore, it is possible to run the simulation software to any desired number of time increments for any selected cells in the simulation grid.

The ECLIPSE software or any equivalent numerical simulator that can be used in near-wellbore modeling can then be operated to simulate the invasion process. Imbibition relative permeability and imbibition capillary pressure curves should be used where available. In any case, the end-point relative permeability to oil (permeability to oil corresponding to residual oil saturation [Sor] conditions) should be altered to be consistent with the residual oil saturation calculated in the petrophysical solver (from the Rxo and Rt values calculated in the above-described inversion). This is because the Sor calculated in the petrophysical solver is used to calculate the amount of moved hydrocarbon as a fraction of unit volume in order to estimate the mud filtrate invasion volume.

The reservoir simulation model should preferably be initialized with extremely fine grids and small time increments. For example, the grid cells near the wellbore can be about 2.5 mm in length and the time increments about 0.0035 days (300 seconds). Such grid size and time increments are intended to minimize any numerical dispersion in the simulation results proximate the wellbore. At greater lateral distances from the wellbore the grid cells can be larger.

Figure 3:
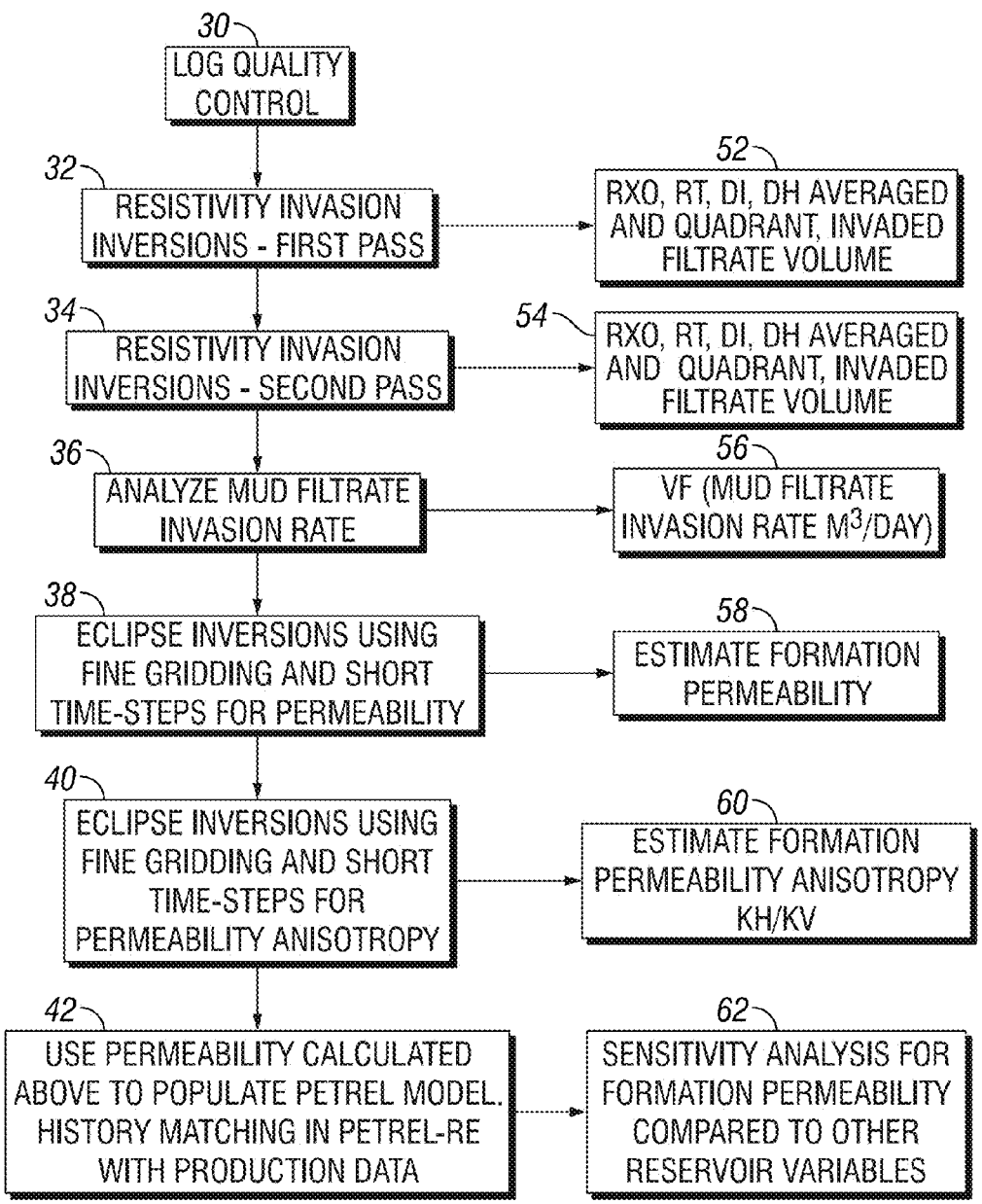
FIG. 3 shows a flow chart of an example process according to the invention.

An example process for estimating permeability from LWD measurements using a reservoir simulation program is shown in a flow chart in FIG. 3. At 30, measurements from the GeoVISION or similar LWD instrument such as described above may be allocated to the rotary orientation at which they were made in order to exclude unreliable measurements, and in some examples to enable determining permeability anisotropy. At 32, measurements made, e.g., from the ring electrode and button electrodes may be inverted to determine Rt, $d_i$ and Rxo shortly after the drill bit has first penetrated a particular formation. At 52, the results of such first inversion include the foregoing parameters at the relevant time and an estimate of invaded fluid volume. At 34, after the well logging instrument has passed the formation a second time, the measurements made may be used to once again invert for Rt, Rxo and $d_i$. At 54, a new value of fluid invasion volume may be determined.

At 36, a fluid invasion rate may be estimated from the difference between the prior two volume calculations and the elapsed time between the measurements made for each inversion. At 56, the mud filtrate invasion rate is determined using the foregoing volumes and elapsed time. At 38, a reservoir simulation program such as the aforementioned ECLIPSE program may be initialized to estimate flow rate of mud filtrate into the formation. At 56, the simulator flow rate is compared to the estimated flow rate. Values of permeability used in the simulation may be adjusted, and the process repeated until a simulation program filtrate invasion rate and the estimated rate made from the repeated measurements substantially match.

At 40, measurement simulations and inversion using the reservoir simulator may be performed using fine grid cell size and fine time increments to estimate formation permeability anisotropy. In one example, the measurements made by the instrument (10 in FIG. 2) may be allocated according to rotary orientation such that differential fluid volumes may be determined with respect to rotary orientation. Such differential fluid volumes with respect to orientation may be used alone or in conjunction with the reservoir simulation program to estimate a maximum permeability direction and a minimum permeability direction of a particular formation, with corresponding maximum and minimum permeability, values. At 60, the result of the foregoing is an estimate of permeability anisotropy. At 42, the determined permeability and anisotropy if calculated may be entered into a reservoir performance simulator (e.g., ECLIPSE or the like) to estimate future production from a well or wells penetrating the particular reservoir. At 62, a sensitivity analysis may be performed to determine the relative effect of permeability on reservoir performance as contrasted with other reservoir parameters, such as pressure, water saturation, wellbore pressure, etc.

The annular pressure while drilling sensor (10F in FIG. 2) may be used in the instrument string can provide an accurate value for the circulating pressure in the annulus while drilling ("bottom hole pressure"). The numerical simulator is configured such that the bottom hole pressure parameter is fixed and the simulator calculates the corresponding filtrate invasion rate that is required to satisfy the injectivity factor for each grid cell, which is related to formation permeability and the pressure drop between the wellbore and the particular formation. If the calculated filtrate (injection) rate is the same as the invasion rate as calculated using the diameters of invasion with respect to time from the GeoVISION measurement inversions, then the permeability estimated in the selected grid cell(s) may be inferred to be a good estimation of actual formation permeability. The permeability in the grid cells can be varied and the reservoir simulation re-run until a good match is obtained between the simulation filtrate invasion rates and the filtrate invasion rates obtained by repeated measurement and inversion using the GeoVISION measurements. The time increment at this point will define the total volume injected whose corresponding invasion diameter will be similar to the invasion diameter calculated in the GeoVISION inversion for this ream pass. An alternative approach is to hold the invasion rate constant and match the bottom hole pressure from the simulator with the annular pressure sensor.

A first pass of the simulation program can be run without accounting for the presence of mudcake. Since mudcake is present (even during dynamic filtration of while-drilling), not accounting for it will result in modeled invasion flow rates from the simulator that may be higher than those obtained from the above described resistivity inversion. Mudcake can be accounted for in the first 2-3 cells from the wellbore. An initial mudcake permeability should be derived from the drilling mud supplier or publications describing test results of filter cake formation. Thereafter, both the mudcake permeability and the formation permeability can be varied so that the values (invasion flow rate or bottom hole pressure) from the simulator program match the values determined from the inversion processing. This would be equivalent to the mudcake permeability during the static filtration invasion phase. The mudcake permeability during the dynamic and static invasion phases are substantially identical. The only thing that is different is the mudcake thickness. In the dynamic phase the mudcake would be thinner than in the static phase. Thinner mudcake would allow a greater mud filtrate invasion into the formation during the dynamic phase as predicted by Darcy's law. Furthermore, there is greater pressure differential between the wellbore and the formation in the dynamic phase resulting from the ECD (equivalent circulating density) of the drilling fluid being greater than its static density. Such higher differential pressure results in higher invasion rate.

Figure 7:
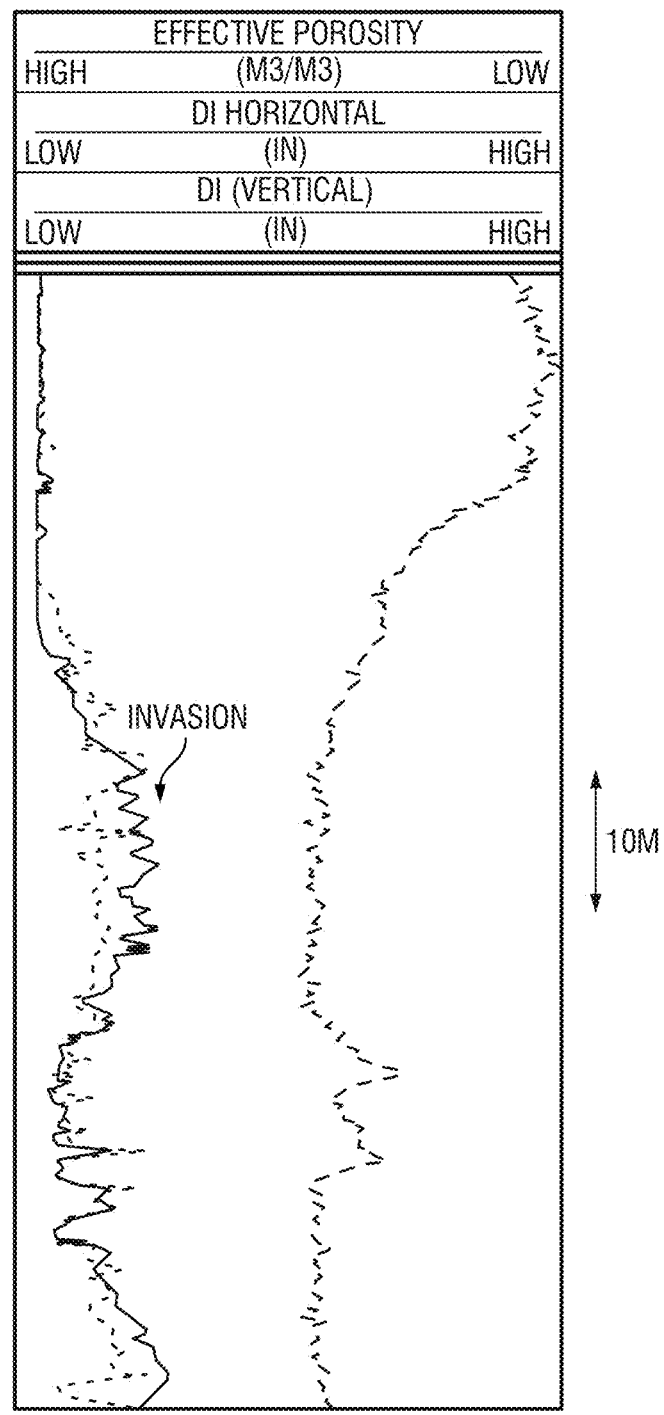
FIG. 7 shows a time lapse comparison of fluid invasion where the rock permeability is anisotropic.

Care should be taken to identify, for each cell, which time increment corresponds to the initial drilling pass, and which time increment corresponds to any subsequent instrument pass. An example of the simulation results is shown in FIG. 7. Permeable zones show deeper invasion fronts than less permeable zones.

Figure 6:
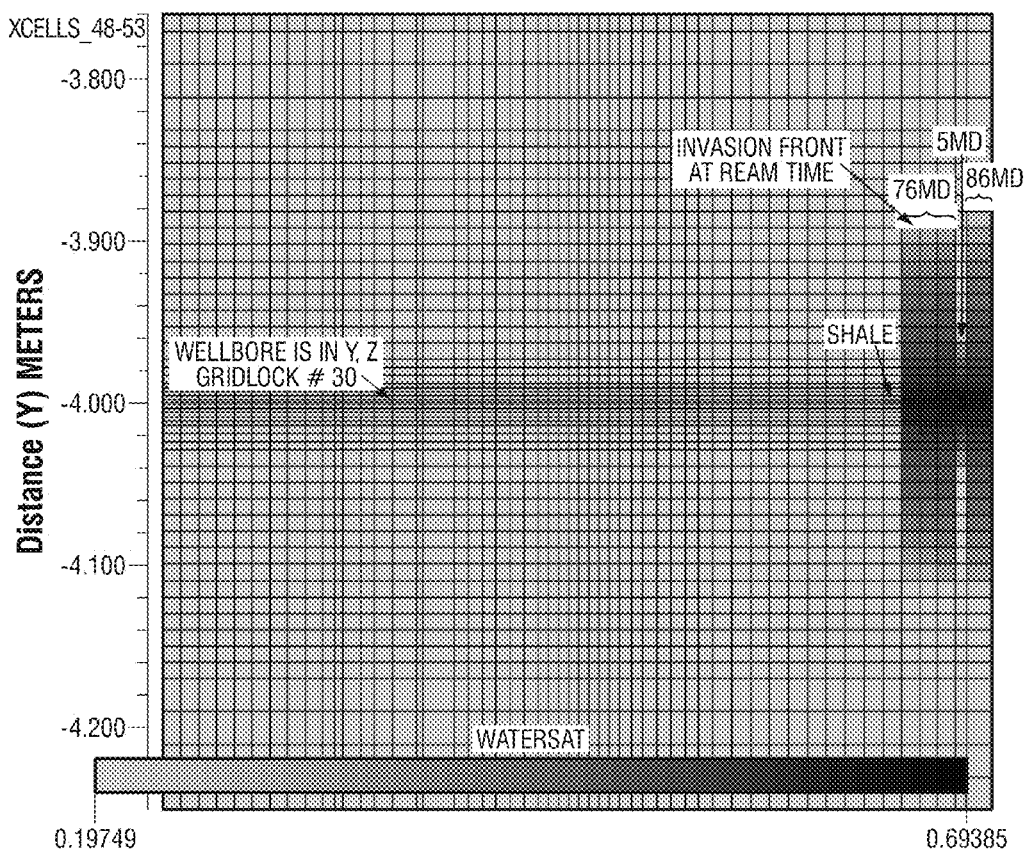
FIG. 6 shows a grid arrangement used in a reservoir simulation according to one aspect of the invention.

FIG. 6 shows an example of permeability estimation only accounting for several gridcells at a time along the horizontal wellbore. This is the position of the front at ream time. Note the importance of including adjacent low permeability formations—a shale formation is located next to the formation of interest.

Figure 8:
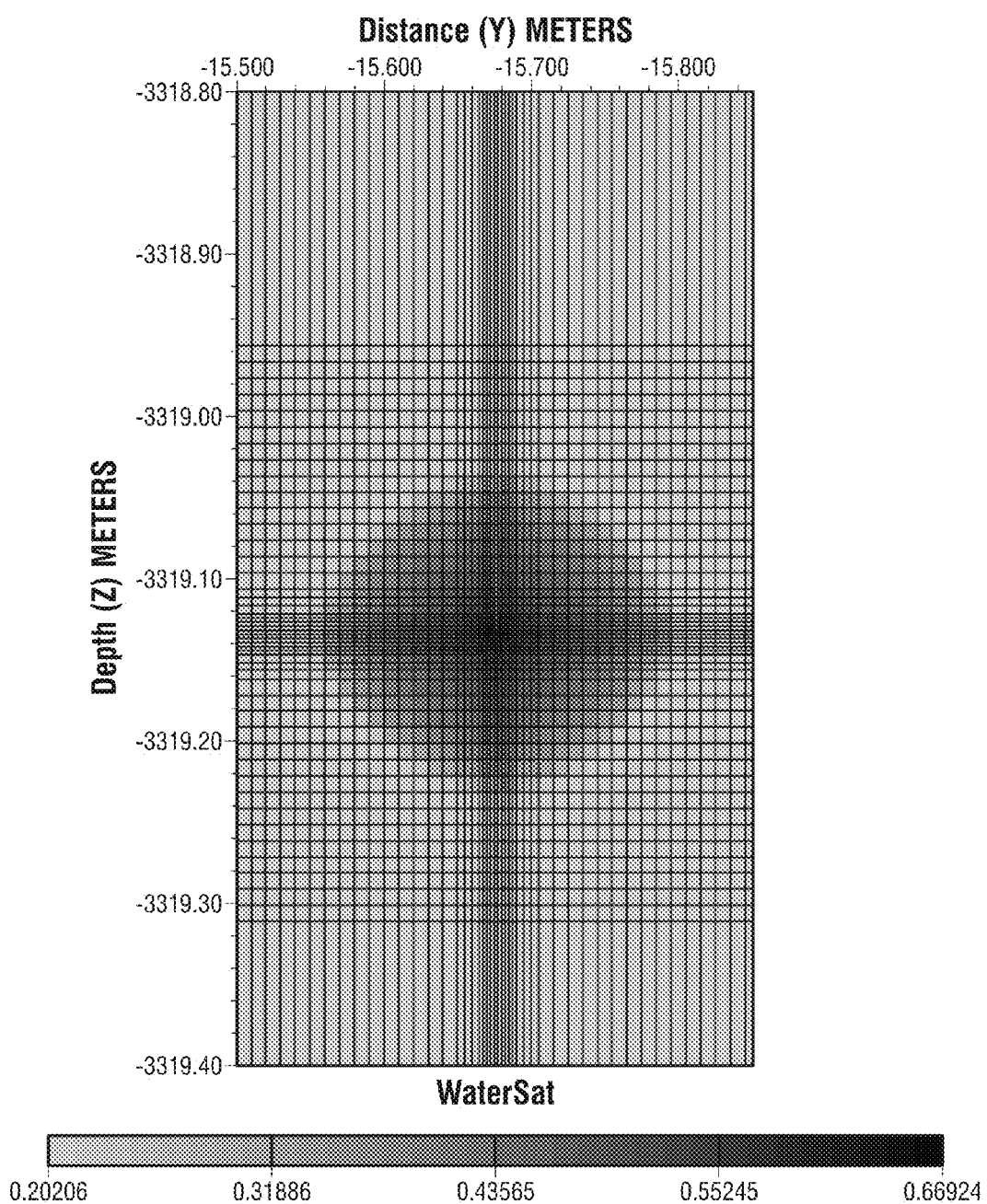
FIG. 8 shows another example simulation grid arrangement.

Permeability anisotropy can be simulated in the ECLIPSE software as shown in FIG. 8 and as explained above. In the example of FIG. 8 the ECLIPSE reservoir simulation model was initialized with a permeability anisotropy ratio ($k_h/k_v$) of 1.63. The permeability anisotropy ratio in the invasion diameters ($D_ih/D_iv$) is 1.33, as can be seen in the result in FIG. 8. It is very important to ensure that grid cell dimensions are equal in all dimensions X, Y and Z. This ensures that transmissabilities between cells are only related to permeability tensors and are not related to transmissibility changes at cell surfaces.

Where gravity effects become important, the down invasion radius may be slightly larger than the up invasion radius. The effects of gravity and capillary pressure forces require the invasion process to be modeled in a numerical simulator; the ratio of the invasion radii calculated through resistivity inversions alone is not enough to estimate the formation permeability anisotropy.

In another embodiment, the well logging instrument described with reference to FIG. 2 may be substituted by a nuclear magnetic resonance ("NMR") well logging instrument. One such instrument is used to provide services under the mark proVISION, which service mark is commonly owned with the present invention. As will be appreciated by those skilled in the art, certain measurements made by the foregoing instrument are related to the bulk volume of water in the pore spaces of the rock formations. Such bulk volume of water may change with respect to time in a manner essentially identical to that explained with reference to FIG. 2. By measuring the bulk volume of water at various times, a volume of hydrocarbon displaced by mud filtrate may be determined, and such volume displacement with respect to time may be used to estimate formation permeability substantially as explained above. As used herein, therefore, the term "parameter related to fluid content of the formation" is intended to include electrical resistivity as well as nuclear magnetic resonance properties, or any similar parameter that can discriminate between hydrocarbon and water such that an amount of native fluid moved by mud filtrate can be determined at any time.

Figure 9:
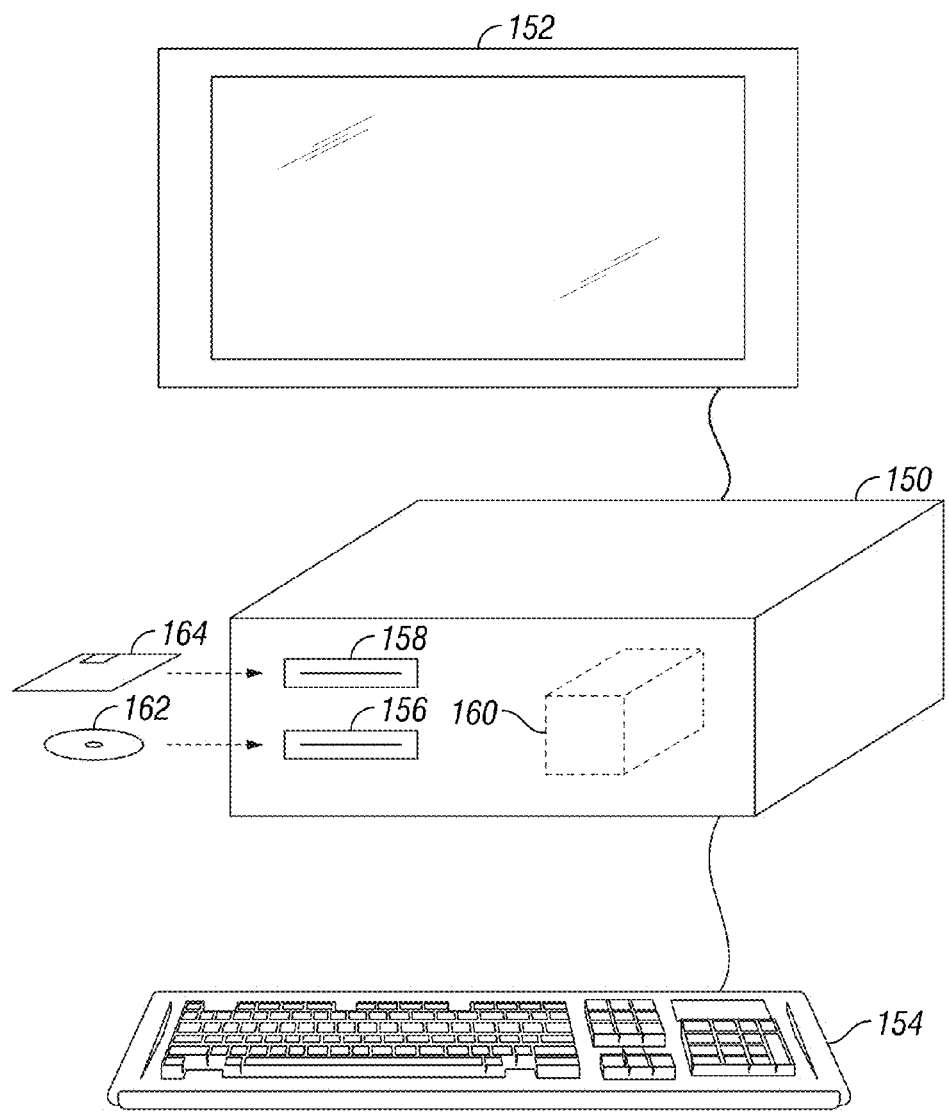
FIG. 9 shows a programmable computer and various forms of computer readable media.

In another aspect, the invention relates to computer programs stored in computer readable media. Referring to FIG. 9, the foregoing process as explained with reference to FIGS. 1-8 can be embodied in computer-readable code. The code can be stored on, e.g., a computer readable medium, such as a floppy disk 164, CD-ROM 162 or a magnetic (or other type) hard drive 166 forming part of a general purpose programmable computer. The computer, as known in the art, includes a central processing unit 150, a user input device such as a keyboard 154 and a user display 152 such as a flat panel LCD display or cathode ray tube display. According to this aspect of the invention, the computer readable medium includes logic operable to cause the computer to execute acts as set forth above and explained with respect to the previous figures.

Methods according to the invention may provide improved estimates of permeability of subsurface rock formations prior to actual fluid sample taking therefrom or flow testing thereof. Accordingly, methods according to the invention may reduce the risk of testing formations that are unlikely to be productive of hydrocarbons, and may provide better results when used with reservoir simulation programs to estimate future reservoir productivity.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A method for determining permeability of a subsurface formation, comprising:
   measuring a parameter related to fluid content of the formation at a first time from within a wellbore penetrating the formation and at a second time later than the first time;
   in a computer, determining a rate of entry of fluid from the wellbore into the formation from the measurement of the parameter made at the first time, wherein determining the rate of entry of the fluid from the wellbore into the formation comprises:
   determining a first lateral depth of invasion of the fluid from the wellbore by inverting the parameter measurements made at the first time;
   determining a second lateral depth of invasion by inverting the parameter measurements made at the second time; and
   calculating a fluid volume at the first and second times from the respective lateral depths of invasion; and
   in the computer, determining permeability from the rate of entry.

2. The method of claim 1 wherein the parameter comprises electrical resistivity measurements having a plurality of different lateral depths of investigation.

3. The method of claim 1 further comprising determining a volume of fluid invasion at the first and second times from the respective lateral depths of invasion.

4. The method of claim 1 wherein the first time is during a continuous drilling operation following initial penetration of the formation by a drill bit.

5. The method of claim 1 wherein the second time is during an operating subsequent to a continuous drilling operation following initial penetration of the formation by a drill bit.

6. The method of claim 5 wherein the subsequent operation comprises at least one of backreaming, washing, inserting a drill string into the wellbore and removing the drill string from the wellbore.

7. The method of claim 1 wherein the parameter measurements are allocated to a rotary orientation of an instrument at a time of measurement.

8. The method of claim 1 further comprising:
   in the computer initializing a model of the subsurface formation into a reservoir simulation program;
   in the computer adjusting at least one of a differential pressure and a permeability in the initialized model until a simulated fluid entry rate from the simulation program substantially matches the fluid entry rate determined from the measurements made at the first and second times.

9. The method of claim 8 further comprising estimating permeability anisotropy in the computer from the reservoir simulation program.

10. The method of claim 1 wherein the fluid in the wellbore is water based.

11. The method of claim 1 wherein the fluid in the wellbore is oil based.

12. A non-transitory computer-readable medium having computer executable instructions that cause a computer to perform the steps of:
   reading a measurement of a parameter related to fluid content of a subsurface rock formation made at a first time from within a wellbore penetrating the formation;
   reading a measurement of the parameter made at a second time after the first time;
   determining a rate of entry of fluid from the wellbore into the formation from the measurements of the parameter made at the first time and at the second time by:
   determining a first lateral depth of invasion of the fluid from the wellbore by inverting the parameter measurements made at the first time;
   determining a second lateral depth of invasion by inverting measurements of the parameter made at the second time; and
   calculating a fluid volume at the first and second times from the respective first and second lateral depths of invasion; and
   determining permeability from the rate of entry.

13. The non-transitory computer-readable medium of claim 12 wherein the parameter comprises electrical resistivity measurements having a plurality of different lateral depths of investigation.

14. The non-transitory computer-readable medium of claim 12, wherein the computer executable instructions further cause the computer to perform the step of determining a volume of fluid invasion at the first and second times from the respective lateral depths of invasion.

15. The non-transitory computer-readable medium of claim 12 wherein the first time is during a continuous drilling operation following initial penetration of the formation by a drill bit.

16. The non-transitory computer-readable medium of claim 12 wherein the second time is during an operating subsequent to a continuous drilling operation following initial penetration of the formation by a drill bit.

17. The non-transitory computer-readable medium claim 16 wherein the subsequent operation comprises at least one of backreaming, washing, inserting a drill string into the wellbore and removing the drill string from the wellbore.

18. The non-transitory computer-readable medium of claim 12 wherein the parameter measurements are allocated to a rotary orientation of an instrument at a time of measurement.

19. The non-transitory computer-readable medium of claim 12 wherein the computer executable instructions further cause the computer to perform steps of:
   initializing a model of the subsurface formation into a reservoir simulation program; and
   adjusting at least one of a differential pressure and a permeability in the initialized model until a simulated fluid entry rate from the simulation program substantially matches the fluid entry rate determined from the measurements made at the first and second times.

20. The non-transitory computer-readable medium of claim 12 wherein the computer executable instructions further cause the computer to estimate permeability anisotropy from the reservoir simulation program.

21. The non-transitory computer-readable medium of claim 12 wherein the fluid in the wellbore is water based.

22. The non-transitory computer-readable medium of claim 12 wherein the fluid in the wellbore is oil based.

* * * * *